United States Patent
Liu et al.

(10) Patent No.: US 8,836,556 B2
(45) Date of Patent: Sep. 16, 2014

(54) ADC, IC INCLUDING THE SAME, AND ADC METHOD THEREOF

(71) Applicant: MediaTek Singapore Pte. Ltd., Singapore (SG)

(72) Inventors: Yingyi Liu, Hefei (CN); Yu-Kai Chou, Hsinchu (TW); Kun Lan, Hefei (CN)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/799,528

(22) Filed: Mar. 13, 2013

(65) Prior Publication Data

US 2013/0293403 A1 Nov. 7, 2013

(30) Foreign Application Priority Data

May 3, 2012 (CN) .......................... 2012 1 0135786

(51) Int. Cl.
*H03M 1/00* (2006.01)
*H03M 1/12* (2006.01)

(52) U.S. Cl.
CPC .................................. *H03M 1/1245* (2013.01)
USPC ......................................... 341/122; 341/118

(58) Field of Classification Search
CPC ...... H03M 1/1245; H03M 1/12; H03M 1/124
USPC .......... 341/155, 172, 118, 120, 143, 139, 122
See application file for complete search history.

(56) References Cited

U.S. PATENT DOCUMENTS

| | | | | | |
|---|---|---|---|---|---|
| 4,857,860 | A | * | 8/1989 | Sevastopoulos | 330/107 |
| 5,796,300 | A | * | 8/1998 | Morgan | 330/9 |
| 6,087,897 | A | * | 7/2000 | Wang | 330/9 |
| 6,191,648 | B1 | * | 2/2001 | Lewicki | 327/554 |
| 6,205,258 | B1 | * | 3/2001 | Lin | 382/274 |
| 6,747,264 | B2 | * | 6/2004 | Miida | 250/214 AG |
| 7,265,706 | B2 | * | 9/2007 | Boemler | 341/163 |
| 7,863,934 | B2 | * | 1/2011 | Lin | 326/82 |
| 8,552,798 | B2 | * | 10/2013 | Leonardo | 330/9 |
| 2012/0056630 | A1 | * | 3/2012 | Itou et al. | 324/679 |

* cited by examiner

*Primary Examiner* — Peguy Jean Pierre
(74) *Attorney, Agent, or Firm* — McClure, Qualey & Rodack, LLP

(57) ABSTRACT

An Analog to Digital Converter (ADC), an analog-to-digital conversion method, and an integrated circuit including the ADC. The ADC includes an input adjustment buffer stage, a sub-ADC, and a sample switch. The sample switch is coupled between the output node of the input adjustment buffer stage and the input node of the sub-ADC. When the sample switch is opened, the input adjustment buffer stage is configured to switch between a first work state and a second work state according to a predetermined rule, and to adjust an input voltage signal of the input adjustment buffer stage based on transitions between the first and second work states. When the sample switch is closed, the input adjustment buffer stage is configured to provide an adjusted voltage signal to the input node of the sub-ADC, and the sub-ADC is configured to perform an analog-to-digital conversion onto the adjusted voltage signal.

17 Claims, 10 Drawing Sheets

US 8,836,556 B2

ADC, IC INCLUDING THE SAME, AND ADC METHOD THEREOF

CROSS REFERENCE TO RELATED APPLICATIONS

This application claims priority of Chinese Patent Application No. 201210135786.9, filed on May 3, 2012, the entirety of which is incorporated by reference herein.

BACKGROUND OF THE INVENTION

1. Field of the Invention

The present invention relates to analog-to-digital conversion, and in particular relates to an Analog to Digital Converter (ADC), an analog-to-digital conversion method, and an integrated circuit including the ADC.

2. Description of the Related Art

Digital technology, especially computer technology, is a fast-growing and widely-adopted technology. In the control, communication, and testing fields, the processing of signals employs digital computing technology to a great extent. In practice, since the system typically works with certain analog signals such as temperature, pressure, motion displacement, or image, it is required to convert the analog signals into digital signals before various computing devices and digital apparatuses can recognize and process the signals. The circuit for converting an analog signal into a digital format is referred to as an Analog to Digital Converter (ADC).

FIG. 1 is a block diagram of a servo ADC (SV ADC) in the related art. A buffer is coupled to the input node of the ADC, and a multiplexer (MUX) outputs the output signal to the buffer amplifier. Since the input analog signal is continuous, and the output digital data are discrete, the ADC is required to sample the input analog signal at a selected sequence of instantaneous times, or certain predetermined points on the time axis, then convert the sampled values into output digital data DATA. Therefore a sample switch is required to be placed between the buffer and the ADC to provide the buffered signal in the buffer to the ADC as the input voltage for the analog-to-digital conversion.

FIG. 2 is a timing diagram for analog-to-digital conversion performed by the SV ADC in FIG. 1. As depicted in FIG. 2, the SV ADC requires 5T in time for completing the data sampling, and requires 11T in time for the conversion, wherein T is a clock cycle of the clock ck. After the conversion is completed, the ADC can release a ready signal, or a RDY signal, the falling edge of the RDY signal can serve as a flag signaling that the digital data DATA is ready. After 2T following the falling edge of the RDY signal, the MUX can switch the inputs, then in the following 9T, the buffer is in an idle state. Utilization of the idle state for the buffer can increase the efficiency of the analog-to-digital conversion.

BRIEF SUMMARY OF THE INVENTION

In one aspect of the invention, an Analog to Digital Converter (ADC) is disclosed, comprising: an input adjustment buffer stage, a sub-ADC, and a sample switch. The sample switch is coupled between the output node of the input adjustment buffer stage and the input node of the sub-ADC. When the sample switch is opened, the input adjustment buffer stage is configured to switch between a first work state and a second work state according to a predetermined rule, and adjust an input voltage signal of the input adjustment buffer stage based on transitions between the first and second work states. When the sample switch is closed, the input adjustment buffer stage is configured to provide an adjusted voltage signal to the input node of the sub-ADC, and the sub-ADC is configured to perform an analog-to-digital conversion onto the adjusted voltage signal.

In another aspect of the invention, an Integrated Circuit (IC) is provided, comprising an ADC comprising an input adjustment buffer stage, a sub-ADC and a sample switch. The sample switch is coupled between the output node of the input adjustment buffer stage and the input node of the sub-ADC. When the sample switch is opened, the input adjustment buffer stage is configured to switch between a first work state and a second work state according to a predetermined rule, and adjust an input voltage signal of the input adjustment buffer stage based on transitions between the first and second work states. When the sample switch is closed, the input adjustment buffer stage is configured to provide an adjusted voltage signal to the input node of the sub-ADC, and the sub-ADC is configured to perform an analog-to-digital conversion onto the adjusted voltage signal.

In yet another aspect of the invention, an Analog-to-Digital Conversion (ADC) method is described, comprising receiving an input voltage signal; adjusting the input voltage signal by switching between a first work state and a second work state according to a predetermined rule to generate an adjusted voltage signal; buffering and holding the adjusted voltage signal; and performing the Analog-to-Digital Conversion onto the buffered and held voltage signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

A detailed description is given in the following embodiments with reference to the accompanying drawings.

Figure 3:
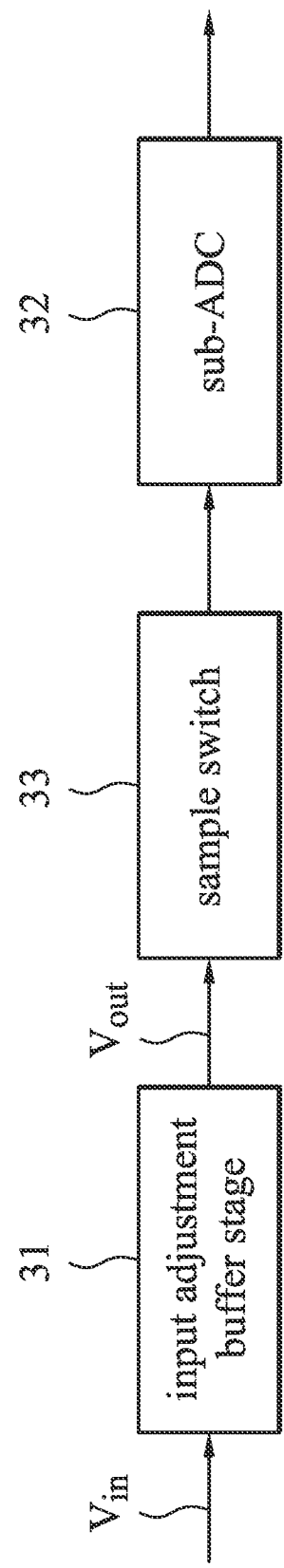
FIG. 3 is a block diagram of an ADC according to an embodiment of the invention.

FIG. 3 is a block diagram of an ADC according to an embodiment of the invention, comprising an input adjustment buffer stage 31, a sub-ADC 32, and a sample switch 33 coupled between the output node of the input adjustment buffer stage 31 and the input node of the sub-ADC 32.

When the sample switch 33 is opened, the input adjustment buffer stage 31 is configured to switch between a first work state and a second work state according to a predetermined rule, adjust the input voltage signal of the input adjustment buffer stage 31 based on conversions of the first and second work states for the succeeding signal processing, and then hold and buffer the adjusted voltage signal. When the sample switch 33 is closed, the input adjustment buffer stage 31 is configured to provide the adjusted voltage signal to the input node of the sub-ADC 32, and the sub-ADC 32 is configured to perform a digital conversion on the adjusted voltage signal.

The first work state may be a sample work state of the input adjustment buffer stage 31. The second work state may be a hold work state of the input adjustment buffer stage 31. The input adjustment buffer stage 31 may be implemented by a buffer including a sample and hold conversion circuit.

The input node of the input adjustment buffer stage 31 is configured to receive an analog signal for the analog-to-digital conversion, such as an analog voltage signal. When the sample switch 33 is opened, the input adjustment buffer state stage 31 is configured to adjust the analog signal for the analog-to-digital conversion through the first work state and the second work state, and buffer and hold the adjusted signal. After a conversion cycle which includes one first work state and one second work state, the input adjustment buffer stage 31 can adjust the analog signal for the analog-to-digital conversion, which is converted into the signal for the succeeding signal processing. For example, the input analog voltage signal is converted into a DC voltage signal conforming to a specific voltage range. The voltage signal $V_{out}$ at the output node of the input adjustment buffer stage 31 can be expressed as $V_{out}=k \times V_{in}$, wherein $V_{in}$ is the input voltage signal at the input node of the input adjustment buffer stage 31, and k is a positive number, determined by the parameters of the circuit components in the input adjustment buffer stage 31.

Figure 4:
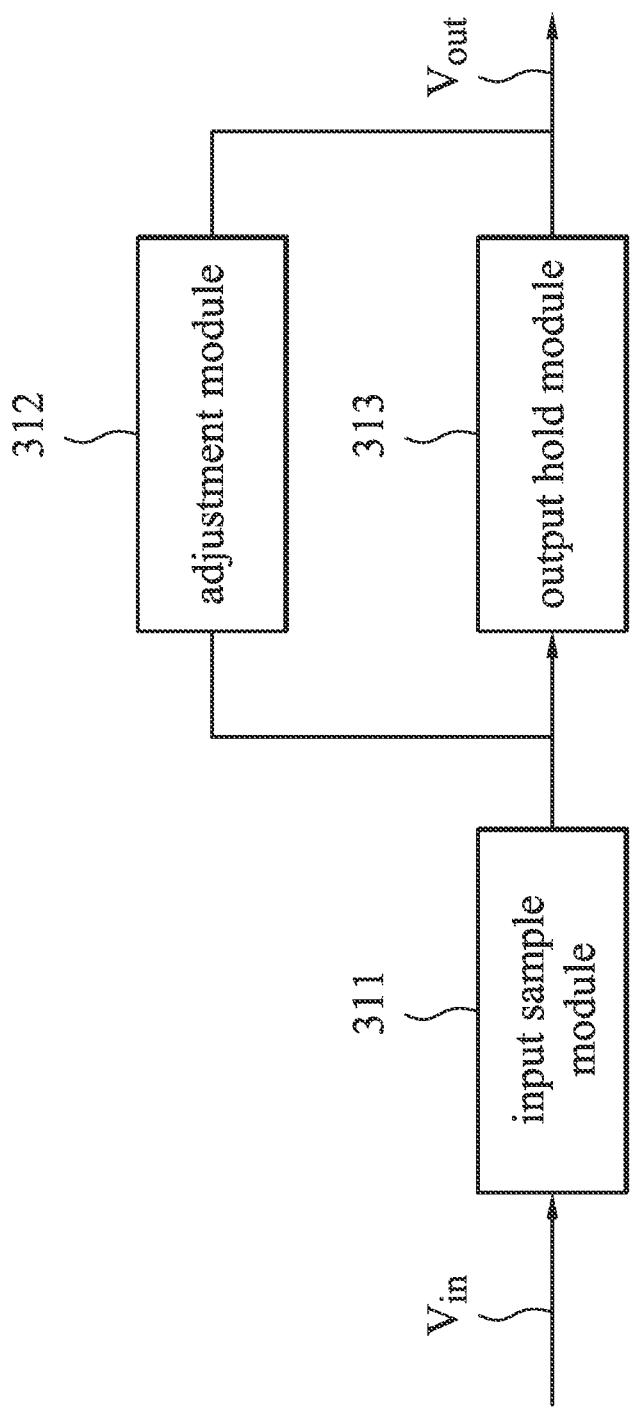
FIG. 4 is a block diagram of the input adjustment buffer stage 31 of the ADC in FIG. 3.

FIG. 4 is a block diagram of the input adjustment buffer stage 31 in FIG. 3, comprising an input sample module 311, an adjustment module 312 and an output hold module 313. When the input adjustment buffer stage 31 is in the first work state such as the sample work state, the input sample module 311 is configured to receive and sample the input signal $V_{in}$, to output a sample signal. When the input adjustment buffer stage 31 is in the second work state such as the hold work state, the adjustment module 312 is configured to receive and adjust the sample signal to generate an adjusted sample signal. The output hold module 313 is then configured to buffer and hold the adjusted sample signal, and output the adjusted sample signal as an output signal $V_{out}$ of the input adjustment buffer stage 31 at an appropriate timing.

Figure 1:
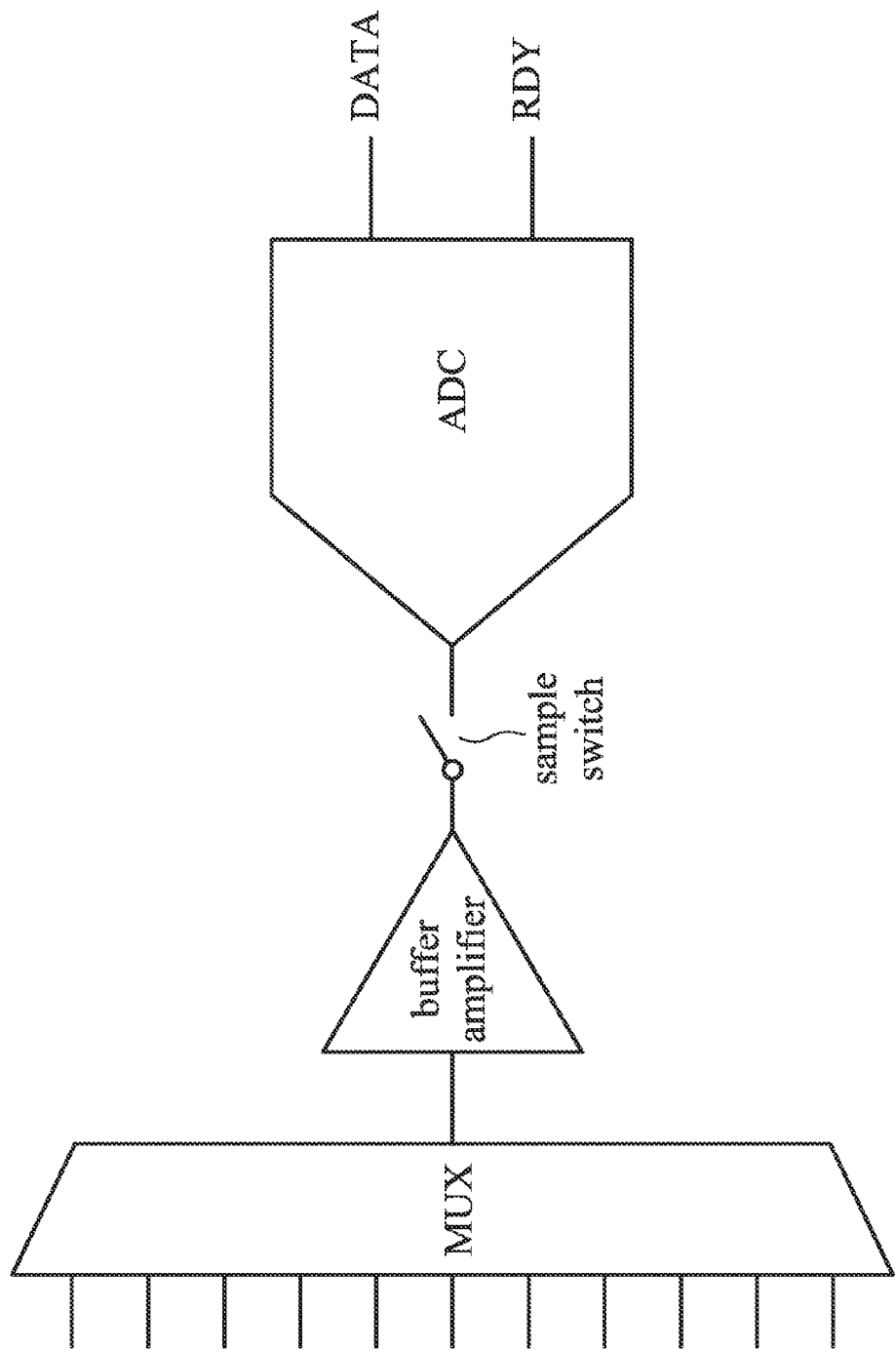
FIG. 1 is a block diagram of a servo ADC (SV ADC) in the related art.
Figure 2:
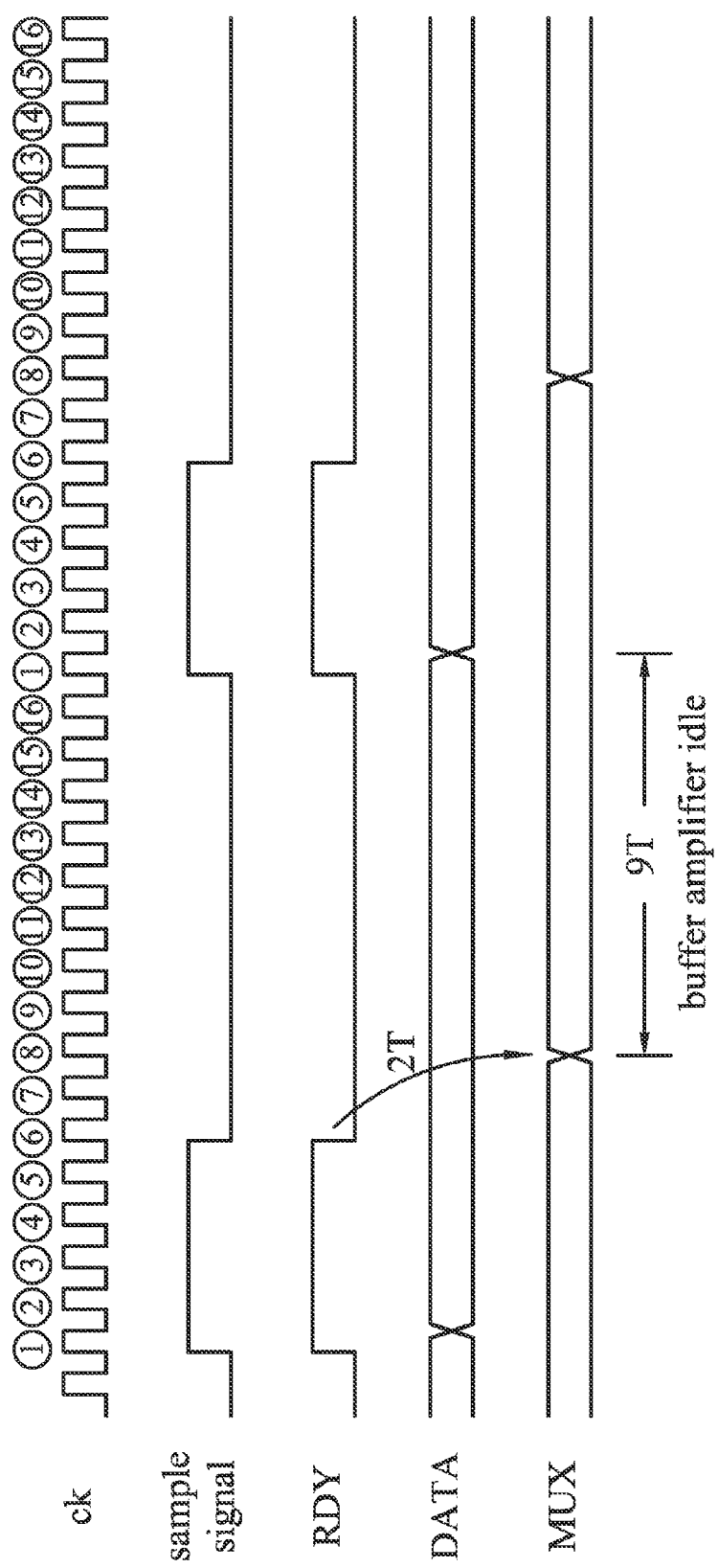
FIG. 2 is a timing diagram for the analog-to-digital conversion performed by the SV ADC in FIG. 1.
Figure 5:
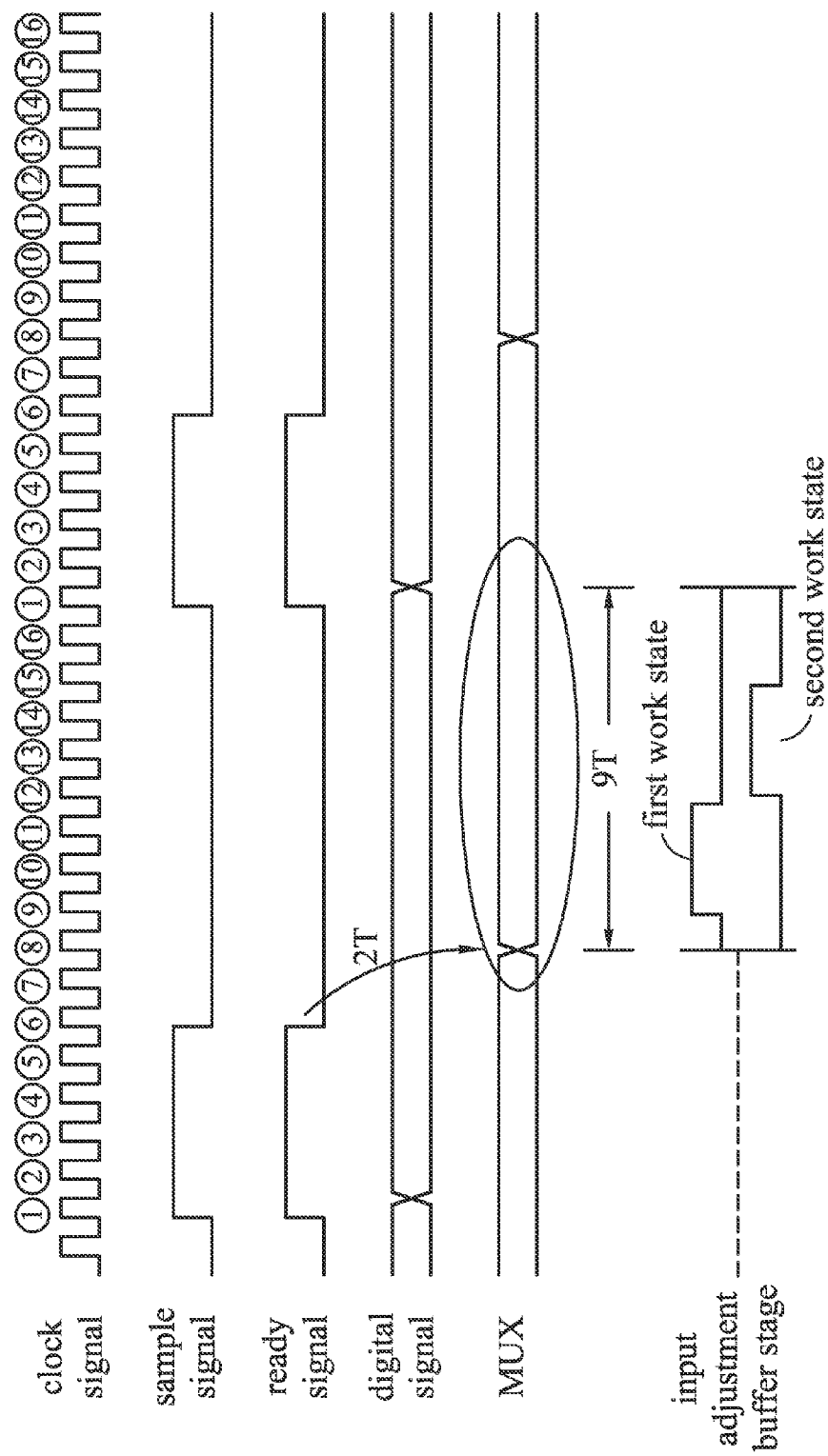
FIG. 5 is a timing diagram for the analog-to-digital conversion performed by the ADC according to an embodiment of the invention.

FIG. 5 is a timing diagram for the analog-to-digital conversion performed by the ADC according to an embodiment of the invention. Please refer to FIGS. 3, 4, and 5. As depicted in FIG. 5, the timing diagram illustrates one period of the work procedure for the input adjust buffer stage. The length of time for the first work state and the second work state may be configured as required, so long as the total length of time for the first work state and the second work state, or the length of time for the conversion period, is less than or equal to the original idle period for the buffer, such as the 9T period in FIG. 2, i.e., the overall work timing of the ADC may remain the same. Please note that different types of the succeeding sub-ADC 32 may have different response times, rendering varied idle times for the buffer, and leading to different limited conditions for the total length of time of the first work state and the second work state in FIG. 5, for example, the total length of time exceeds or is less than 9T. A person with ordinary skill in the art may recognize that the total length of 9T for the first work state and the second work state may not pose a limitation for the embodiments of the invention, and the variation of the total length of time is within the scope of the invention.

The ADC of the invention can utilize the idle state of the buffer to promote the efficiency of the analog-to-digital conversion. Based on the embodiments, when the sample switch 33 is closed, the input adjustment buffer stage 31 can switch between the first work state and the second work state according to a predetermined rule to adjust the to-be-output analog voltage signal, thereby adjusting the input voltage signal provided to the input node of the sub-ADC for analog-to-digital conversion into a more appropriate signal for succeeding signal processing without modifying the overall work timing of the ADC. In one aspect, the interference or noise can be efficiently reduced or removed from the adjusted voltage signal, since the adjusted voltage signal is a DC voltage, increasing the performance of the analog-to-digital conversion in the sub-ADC. In another aspect, the input signal is adjusted prior to the sub-ADC, preventing the sub-ADC from being damaged due to excessively high voltage of the input signal.

Figure 6:
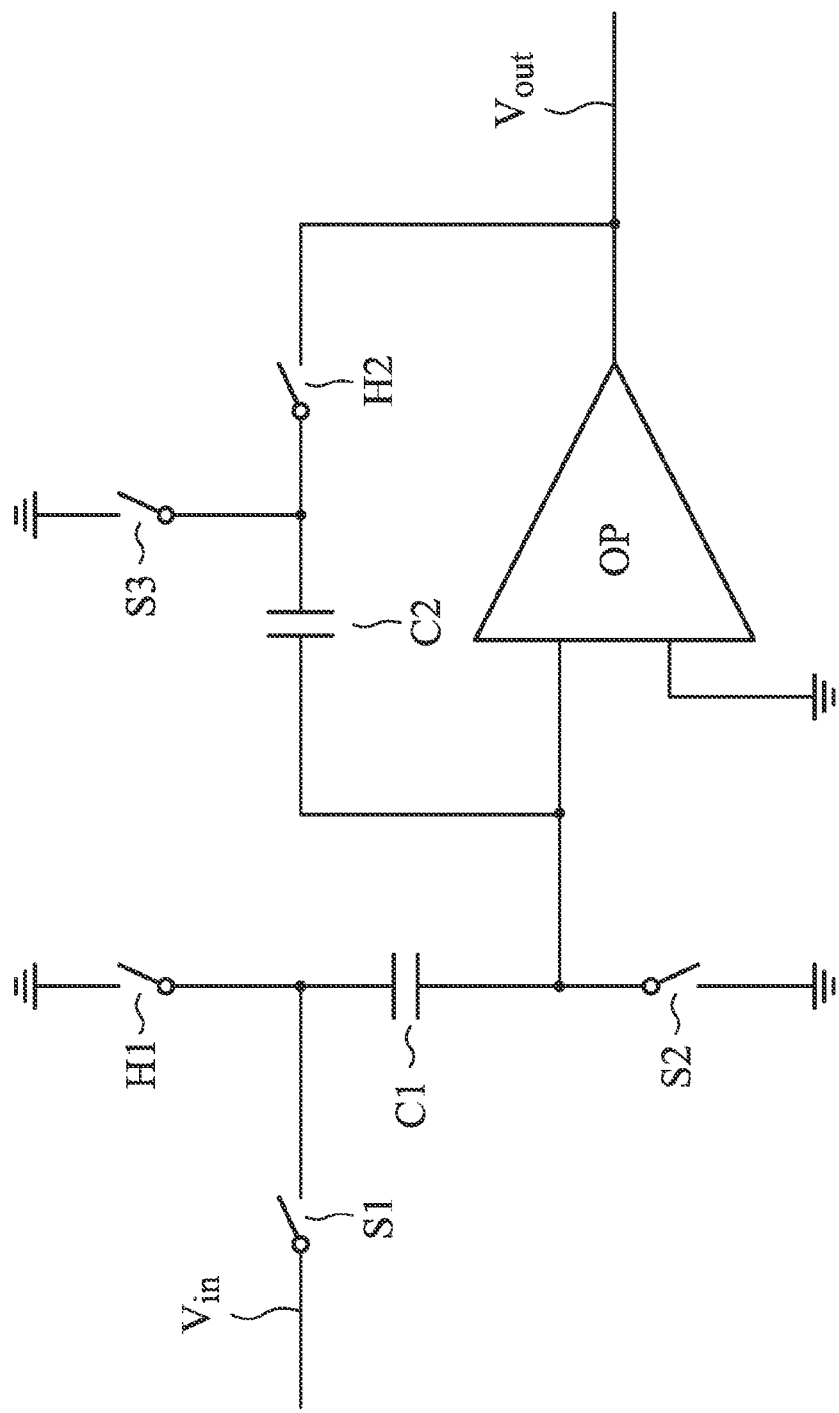
FIG. 6 is a circuit schematic of the input adjustment buffer stage according to an embodiment of the invention.

FIG. 6 is a circuit schematic of the input adjustment buffer stage according to an embodiment of the invention. In the ADC realized by the embodiment in FIG. 6, the input adjustment buffer stage includes an operational amplifier OP, a first capacitor C1, a second capacitor C2, a first sub-sample switch S1, a second sub-sample switch S2, a third sub-sample switch S3, a first sub-hold switch H1, and a second sub-hold switch H2.

The inverted input node of the operational amplifier OP is coupled to the first node of the first capacitor C1, and to the input node of the input adjustment buffer stage through the first capacitor C1 and the first sub-sample switch S1. The inverted input node is also coupled to the first node of the second capacitor C2, and to the output node of the input adjustment buffer stage through the second capacitor C2 and the second sub-hold switch H2. The non-inverted input node of operational amplifier OP is coupled to the ground. The second sub-sample switch S2 is coupled between the inverted input node of the operational amplifier OP and the ground. The third sub-sample switch S3 is coupled between a second node of the second capacitor C2 and the ground. The first sub-hold switch H1 is coupled between the second node of the first capacitor C1 and the ground.

When the input adjustment buffer stage is in the first work state, such as the sample state, the first sub-sample switch S1, the second sub-sample switch S2, and the third sub-sample switch S3 are closed, whereas the first sub-hold switch H1 and the second sub-hold switch H2 are opened. The input voltage $V_{in}$ at the input node of the input adjustment buffer stage charges the first capacitor C1.

When the input adjustment buffer stage is in the second work state, such as the hold state, the first sub-sample switch S1, the second sub-sample switch S2, and the third sub-sample switch S3 are opened, whereas the first sub-hold switch H1 and the second sub-hold switch H2 are closed. The first capacitor C1 discharges while charging up the second capacitor C2. If the sample switch 33 between the operational amplifier OP and the sub-ADC is disconnected at this point, the output voltage signal of the input adjustment buffer stage would be buffered and held at the output node of the operational amplifier OP. If the sample switch 33 is closed, the output voltage signal of the input adjustment buffer stage could provide a stable output voltage $V_{out}$ expressed by:

$$V_{out} = \frac{C1}{C2} V_{in} \quad \text{Eq. [1]}$$

Eq. [1] shows that by altering the ratio between capacitances of the first capacitor C1 and the second capacitor C2, the gain of the input adjustment buffer stage can be changed. For example, the range of the input voltage $V_{in}$ may be 0~2.8V, the range of the input voltage signal of the sub-ADC may be 0~0.7V, and the ratio between the capacitance of the capacitor C1 and the second capacitor C2 may be configured as 0.25.

Figure 7:
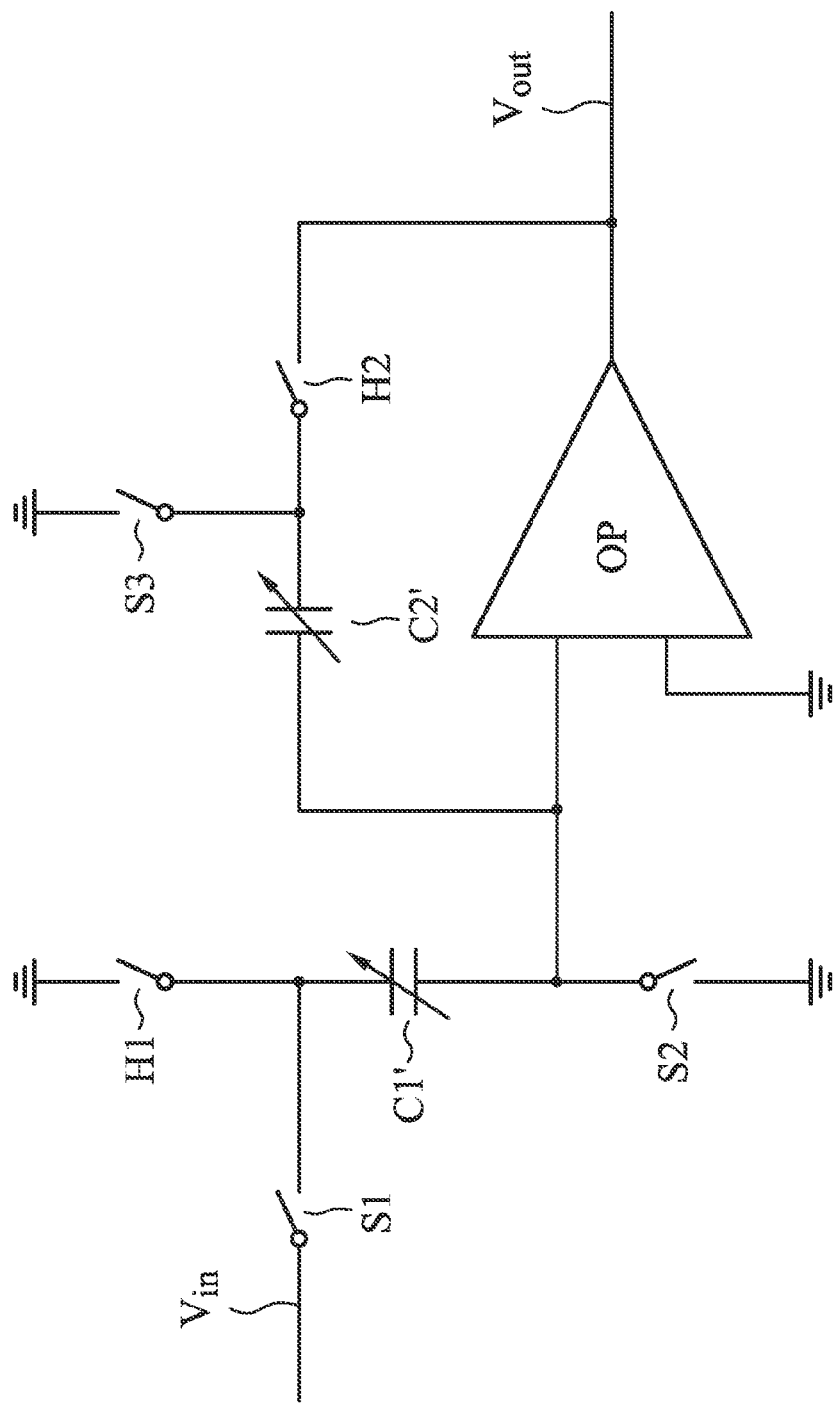
FIG. 7 is a circuit schematic of the input adjustment buffer stage according to another embodiment of the invention.

FIG. 7 is a circuit schematic of the input adjustment buffer stage according to another embodiment of the invention. The input adjustment buffer stage in FIG. 7 is distinct from that in FIG. 6, in that the first capacitor C1 and the second capacitor C2 can be realized by variable capacitors C1' and C2' respectively. Due to various voltage ranges of the input signals for input adjustment buffer stage, various gains are provided to ensure the voltage range of the output signal falls within a predetermined range. With the variable capacitors C1' and C2', the gain of the input adjustment buffer stage can be adjusted to ensure the predetermined voltage range of the output signal. People with ordinary skill in the art can recognize that controls of the variable capacitors may be realized by determining the voltage range of the input signal. For example, when the voltage range of the detected input signal is 0~2.8V, the ratio between capacitance of the variable capacitors C1' and C2' may be configured as 1:4, so that the range of the output voltage may be kept at 0~0.7V. The operations and connections for other devices in the input adjustment buffer stage in FIG. 7 are similar to those in FIG. 6, reference therefore can be found in the preceding paragraphs and will not be repeated here.

Figure 8:
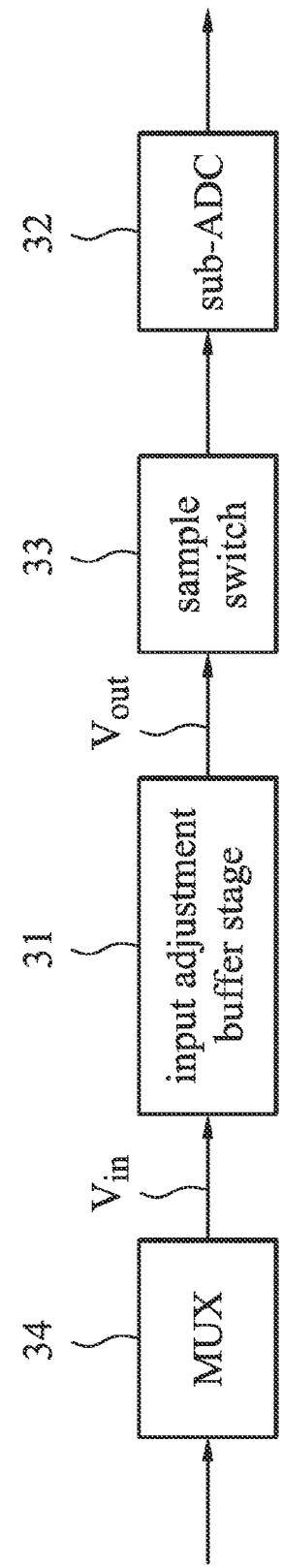
FIG. 8 is a block diagram of an ADC according to another embodiment of the invention.

FIG. 8 is a block diagram of an ADC according to another embodiment of the invention. The ADC in FIG. 8 further includes a multiplexer 34, coupled to the input adjustment buffer stage 31, selecting one from a plurality of analog input signals to provide to the input node of the input adjustment buffer stage 31.

Specifically, when being applied to a plurality of analog signal sources, the multiplexer 34 may be useful for analog-to-digital conversion of the plurality of the analog signal sources. Under this condition, voltage range differences between the analog signals output from various analog signal sources may be increased. Consequently, adjusting the input voltage signal by the input adjustment buffer stage is crucial in terms of the protection for the sub-ADC.

Further, in the ADC of the embodiment, the sub-ADC may be of a Successive Approximation Register (SAR) type of the ADC. However, the type of ADC is not limited to the SAR type, and those who are skilled in the art can recognize that other types of ADCs may be utilized for the sub-ADC in the embodiment.

Figure 9:
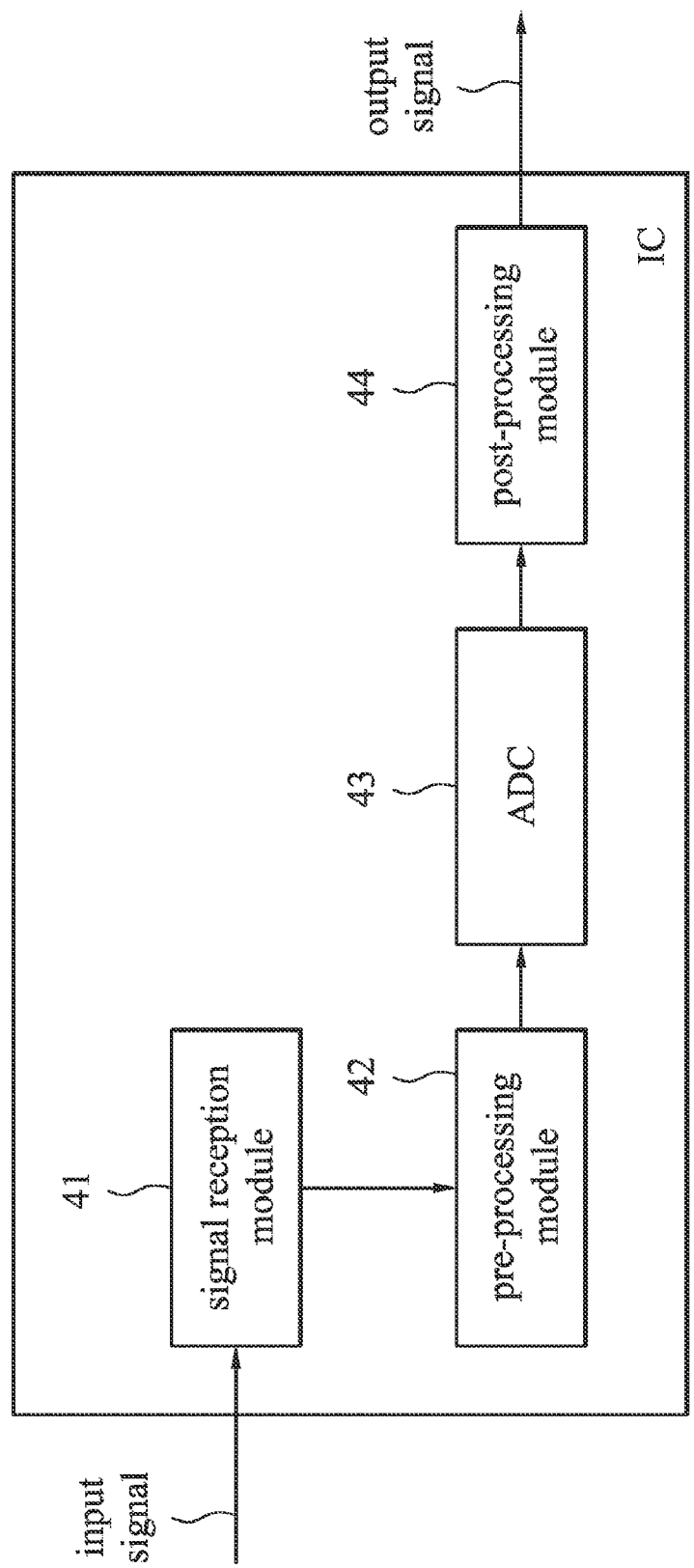
FIG. 9 is a block diagram of an IC including an ADC according to an embodiment of the invention.

The ADC of the invention can receive and convert the analog signal into digital for succeeding signal processing by a digital signal processor (DSP), including an integrated circuit (IC) or the controllers or processors of the like. In particularly, one or more ADCs of the invention may be used in the DSP for the telecommunication application. FIG. 9 is a block diagram of an IC including the ADC according to an embodiment of the invention. As shown in FIG. 9, the IC contains a signal reception module 41, a pre-processing module 42, an ADC 43 and a post-processing module 44. The signal reception module 41 is configured to receive the input signal such as an analog signal, and transfer the input signal to the pre-processing module 42. The pre-processing module 42 is configured to perform pre-processing such as signal filtering onto the received signal, and output the pre-processed signal to the ADC 43. According to the embodiments of the invention, the ADC 43 may contain the input adjustment buffer stage which adjusts the input signal of the input adjustment buffer stage. Therefore, when the ADC 43 receives the pre-processed signal, it can adjust the pre-processed signal by the internal input adjustment buffer stage, and then convert and output the adjusted pre-processed signal into a digital signal for the succeeding signal processing. The post-processing module 44 is configured to receive and process the digital signal output from the ADC 43, and output the processed result as the output signal. Employing the circuit configuration outlined in the embodiments of the invention, the ADC 43 can utilize the input adjustment buffer stage to adjust the input signal, which promotes the dynamic performance of the ADC, and increases the accuracy of the post signal processing and the whole performance of the integrated circuit.

Figure 10:
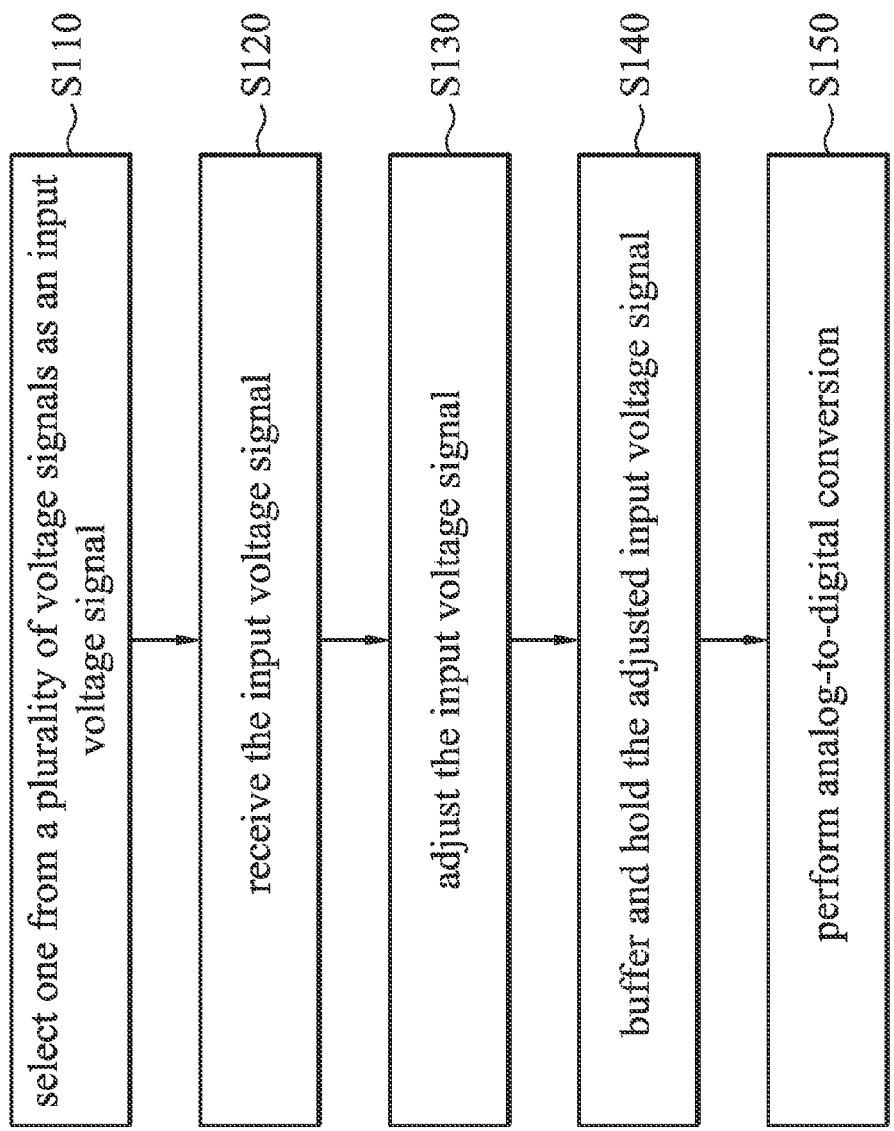
FIG. 10 is a flowchart of an analog-to-digital conversion method according to an embodiment of the invention.

FIG. 10 is a flowchart of an analog-to-digital conversion method according to an embodiment of the invention. The analog-to-digital conversion method is not limited by the steps and sequence of the method shown in FIG. 10, the steps and sequence may be adapted as required by different designs, without deviating from the principle of the invention. In the analog-to-digital conversion method, a voltage signal is selected out of a plurality of voltage signals to serve as the input voltage signal (Step S110), the input voltage signal is then received by the input adjustment buffer stage (Step S120), which in turn adjusts the input voltage signal (Step S130). After buffering and holding the adjusted voltage signal (Step S140), an analog-to-digital conversion is performed onto the held voltage signal (Step S150). Note that Step S110 for selecting the input voltage signal is optional. When only one input voltage signal is available, Step S110 may be omitted.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components, or any combination thereof designed to perform the functions described herein. A general purpose processor may be a microprocessor, but in the alternative, the processor may be any commercially available processor, controller, microcontroller or state machine.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An Analog to Digital Converter (ADC), comprising:
   an input adjustment buffer stage;
   a sub-ADC; and
   a sample switch coupled between an output node of the input adjustment buffer stage and an input node of the sub-ADC;
   wherein when the sample switch is opened, the input adjustment buffer stage is configured to switch between a first work state and a second work state according to a predetermined rule, and when the input adjustment buffer stage switches to the second work state, the input adjustment buffer stage adjusts an input voltage signal of the input adjustment buffer stage to generate an adjusted voltage signal, wherein the input voltage signal is sampled during the first work state;

when the sample switch is closed, the input adjustment buffer stage is configured to provide the adjusted voltage signal to the input node of the sub-ADC, and the sub-ADC is configured to perform an analog-to-digital conversion onto the adjusted voltage signal.

2. The ADC of claim 1, wherein the input adjustment buffer stage comprises:

an input sample module, wherein when the input adjustment buffer stage is in the first work state, the input sample module is configured to receive and sample the input voltage signal to output a sample signal;

an adjustment module, wherein when the input adjustment buffer stage is in the second work state, the adjustment module is configured to receive and adjust the sample signal to generate the adjusted voltage signal; and an output hold module, wherein when the input adjustment buffer stage is in the second work state, the output hold module is configured to buffer and hold the adjusted voltage signal, and provide the adjusted voltage signal to the sub-ADC when the sample switch is closed.

3. The ADC of claim 1, wherein the input adjustment buffer stage comprises an operational amplifier, a first capacitor, a second capacitor, a first sub-sample switch, a second sub-sample switch, a third sub-sample switch, a first sub-hold switch and a second sub-hold switch, wherein an inverted input node of the operational amplifier is coupled to a first node of the first capacitor, and coupled to an input node of the input adjustment buffer stage through the first capacitor and the first sub-sample switch, the inverted input node of the operational amplifier is further coupled to a first node of the second capacitor, and coupled to the output node of the input adjustment buffer stage through the second capacitor and the second sub-sample switch;

a non-inverted input node of the operational amplifier is coupled to a ground;

the second sub-sample switch is coupled between the inverted node of the operational amplifier and the ground;

the third sub-sample switch is coupled between a second node of the second capacitor and the ground; and the first sub-hold switch is coupled between a second node of the first capacitor and the ground.

4. The ADC of claim 3, wherein the first and second capacitors are variable capacitors.

5. The ADC of claim 3, wherein when the input adjustment buffer stage is in the first work state, the first sub-sample switch, the second sub-sample switch, and the third sub-sample switch are closed, and the first sub-hold switch and the second sub-hold switch are opened; and when the input adjustment buffer stage is in the second work state, the first sub-sample switch, the second sub-sample switch, and the third sub-sample switch are opened, and the first sub-hold switch and the second sub-hold switch are closed, wherein the gain of the input adjustment buffer stage is adjusted by altering the ratio of the first capacitor to the second capacitor, to generate the adjusted voltage signal.

6. The ADC of claim 1, further comprising:

a multiplexer, coupled to the input adjustment buffer stage, configured to select one from a plurality of analog signals to provide an input node of the input adjustment buffer stage based on a predetermined order.

7. The ADC of claim 1, wherein the sub-ADC is a Successive Approximation Register (SAR) type of the ADC.

8. An integrated circuit comprising an ADC, wherein the ADC comprises:

an input adjustment buffer stage;

a sub-ADC; and a sample switch coupled between an output node of the input adjustment buffer stage and an input node of the sub-ADC;

wherein when the sample switch is opened, the input adjustment buffer stage is configured to switch between a first work state and a second work state according to a predetermined rule, and when the input adjustment buffer stage switches to the second work state, the input adjustment buffer stage adjusts an input voltage signal of the input adjustment buffer stage to generate an adjusted voltage signal, wherein the input voltage signal is sampled during the first work state;

when the sample switch is closed, the input adjustment buffer stage is configured to provide the adjusted voltage signal to the input node of the sub-ADC, and the sub-ADC is configured to perform an analog-to-digital conversion onto the adjusted voltage signal.

9. The integrated circuit of claim 8, wherein the input adjustment buffer stage comprises:

an input sample module, wherein when the input adjustment buffer stage is in the first work state, the input sample module is configured to receive and sample the input voltage signal to output a sample signal;

an adjustment module, wherein when the input adjustment buffer stage is in the second work state, the adjustment module is configured to receive and adjust the sample signal to generate the adjusted voltage signal; and an output hold module, wherein when the input adjustment buffer stage is in the second work state, the output hold module is configured to buffer and hold the adjusted voltage signal, and provide the adjusted voltage signal to the sub-ADC when the sample switch is closed.

10. The integrated circuit of claim 8, wherein the input adjustment buffer stage comprises an operational amplifier, a first capacitor, a second capacitor, a first sub-sample switch, a second sub-sample switch, a third sub-sample switch, a first sub-hold switch and a second sub-hold switch, wherein an inverted input node of the operational amplifier is coupled to a first node of the first capacitor, and coupled to an input node of the input adjustment buffer stage through the first capacitor and the first sub-sample switch, the inverted input node of the operational amplifier is further coupled to a first node of the second capacitor, and coupled to the output node of the input adjustment buffer stage through the second capacitor and the second sub-sample switch;

a non-inverted input node of the operational amplifier is coupled to a ground;

the second sub-sample switch is coupled between the inverted node of the operational amplifier and the ground;

the third sub-sample switch is coupled between a second node of the second capacitor and the ground; and the first sub-hold switch is coupled between a second node of the first capacitor and the ground.

11. The integrated circuit of claim 10, wherein the first and second capacitors are variable capacitors.

12. The integrated circuit of claim 10, wherein when the input adjustment buffer stage is in the first work state, the first sub-sample switch, the second sub-sample switch, and the third sub-sample switch are closed, and the first sub-hold switch and the second sub-hold switch are opened; and when the input adjustment buffer stage is in the second work state, the first sub-sample switch, the second sub-sample switch, and the third sub-sample switch are opened, and the first sub-hold switch and the second sub-hold switch are closed, wherein the gain of the input adjustment buffer stage is adjusted by altering the ratio of the first capacitor to the second capacitor, to generate the adjusted voltage signal.

13. The integrated circuit of claim 8, further comprising:
a multiplexer, coupled to the input adjustment buffer stage, configured to select one from a plurality of analog signals to provide an input node of the input adjustment buffer stage based on a predetermined order.

14. The integrated circuit of claim 8, wherein the sub-ADC is a Successive Approximation Register (SAR) type of the ADC.

15. An Analog-to-Digital Conversion (ADC) method, comprising:
sampling an input voltage signal in a first work state;
adjusting the input voltage signal, when switches from the first work state to a second work state according to a predetermined rule to generate an adjusted voltage signal;
buffering and holding the adjusted voltage signal; and
performing the Analog-to-Digital Conversion onto the buffered and held voltage signal.

16. The ADC method of claim 15, wherein the adjusting of the input voltage signal step comprises:
in the first work state, receiving and sampling the input voltage signal to generate a sample signal; and
in the second work state, receiving and adjusting the sampled input voltage signal to generate the adjusted voltage signal.

17. The ADC method of claim 15, further comprising selecting one from a plurality of voltage signals to serve as the input voltage signal.

\* \* \* \* \*